US011112441B2

(12) United States Patent
Geywitz et al.

(10) Patent No.: US 11,112,441 B2
(45) Date of Patent: Sep. 7, 2021

(54) PORTABLE DEVICE FOR MONITORING A SUBJECT AND DETECTING A SOURCE OF INTERFERENCE

(71) Applicant: KONINKLIJKE PHILIPS N.V., Eindhoven (NL)

(72) Inventors: Hansjoerg Geywitz, Kusterdingen (DE); Albrecht Reinhard Kinzkofer, Bondorf (DE)

(73) Assignee: KONINKLIJKE PHILIPS N.V., Eindhoven (NL)

( * ) Notice: Subject to any disclaimer, the term of this patent is extended or adjusted under 35 U.S.C. 154(b) by 0 days.

(21) Appl. No.: 16/619,290

(22) PCT Filed: Jun. 21, 2018

(86) PCT No.: PCT/EP2018/066506
§ 371 (c)(1),
(2) Date: Dec. 4, 2019

(87) PCT Pub. No.: WO2019/002060
PCT Pub. Date: Jan. 3, 2019

(65) Prior Publication Data
US 2020/0141991 A1    May 7, 2020

(30) Foreign Application Priority Data
Jun. 30, 2017   (EP) .................................. 17179109

(51) Int. Cl.
*G01R 29/08*    (2006.01)
*G01R 31/00*    (2006.01)

(52) U.S. Cl.
CPC ....... *G01R 29/0814* (2013.01); *G01R 31/001* (2013.01)

(58) Field of Classification Search
CPC .......................... G01R 29/0814; G01R 31/001
USPC ........................................................ 324/612
See application file for complete search history.

(56) References Cited

U.S. PATENT DOCUMENTS

| | | | |
|---|---|---|---|
| 4,863,265 A | 9/1989 | Flower et al. | |
| 6,727,859 B1 | 4/2004 | Susal | |
| 8,471,713 B2 | 6/2013 | Poeze et al. | |
| 8,754,776 B2 * | 6/2014 | Poeze .................. | A61B 5/0015 340/635 |
| 9,986,919 B2 * | 6/2018 | Lamego ................ | A61B 5/022 |

(Continued)

FOREIGN PATENT DOCUMENTS

| | | |
|---|---|---|
| JP | 3073827 U | 12/2000 |
| WO | 2016040195 A1 | 3/2016 |

OTHER PUBLICATIONS

PCT/EP2018/066506 ISR & WO, dated Sep. 6, 2019, 14 Page Document.

*Primary Examiner* — Christopher P McAndrew

(57) ABSTRACT

There is provided a portable device (100) for monitoring a subject and detecting a source of interference for the portable device (100). The portable device (100) comprises a detector (102) configured to detect the presence of interference in an environment of the portable device (100). The portable device (100) also comprises a processor (104) configured to determine a strength of the interference in the environment of the portable device (100) and to control a user interface (106) to provide an output at a frequency that depends on the determined interference strength.

15 Claims, 4 Drawing Sheets

(56) References Cited

U.S. PATENT DOCUMENTS

| | | | |
|---|---|---|---|
| 9,989,560 B2 * | 6/2018 | Poeze | A61B 5/7203 |
| 10,628,932 B2 * | 4/2020 | Rothberg | G01S 17/00 |
| 10,706,520 B2 * | 7/2020 | Rothberg | G06T 7/0002 |
| 10,799,160 B2 * | 10/2020 | Al-Ali | A61B 5/746 |
| 2008/0167541 A1 | 7/2008 | Takala et al. | |
| 2011/0109459 A1 * | 5/2011 | Poeze | A61B 5/14551 |
| | | | 340/573.1 |
| 2013/0238264 A1 | 9/2013 | Kazama et al. | |

* cited by examiner

PORTABLE DEVICE FOR MONITORING A SUBJECT AND DETECTING A SOURCE OF INTERFERENCE

CROSS-REFERENCE TO PRIOR APPLICATIONS

This application is the U.S. National Phase application under 35 U.S.C. § 371 of International Application No. PCT/EP2018/066506, filed on Jun. 21, 2018, which claims the benefit of European Patent Application No. 17179109.8, filed on Jun. 30, 2017. These applications are hereby incorporated by reference herein.

TECHNICAL FIELD OF THE INVENTION

The invention relates to the field of devices and, in particular, to a portable device for monitoring a subject.

BACKGROUND TO THE INVENTION

Wireless data transmission systems, such as ones that employ radio frequency (RF), are becoming more and more ubiquitous in clinical routines such as in fetal monitoring, as they provide the benefit of allowing a user to move freely in contrast to having limited freedom of movement under restrictions due to cables.

RF communication systems (such as monitoring devices) typically operate in the presence of interfering sources, and sometimes interference coming from such sources may degrade or completely impede the ability of these devices to function properly. In some cases, obvious interference sources, such as other RF equipment in the same room, can be easily identified. However, there are other potential sources of interference or disturbance which may not be straightforward to locate, for example, defective electronic devices, defective fluorescent lights, motors from hairdryers, or bed with defective air pumps.

Many monitoring devices used in a clinical environment, such as obstetrical care radio (OBR), may be easily affected by interfering sources, as explained above. The proprietary protocol for OBR is a real time protocol as opposed to digital data transmission protocols, such as wireless local area network (WLAN) and Bluetooth, where data can be transmitted more than once if there is data loss. For real time protocols, such as the protocols used for OBR, sound data has to be transmitted with zero or minimal time delay. Therefore, repeated transmission of data packages is not possible. There are RF measuring devices currently available on the market for the detection of source(s) of interference, but these measuring devices are expensive and difficult to use for untrained personnel.

An example of a RF measuring device may include an RF spectrum analyzer together with a directional antenna to determine the direction from which interference is emitted. In this case, an untrained user may not be able to comprehend in a straightforward manner the readings from the spectrum analyzer and/or the directional antenna to effectively locate the source of the interference. Furthermore, sometimes the directional antenna (or equivalent or similar components of other types of measuring devices) requires a proper set-up before measurement can take place. It may be time-consuming to set-up the measuring device (e.g. the directional antenna), to train users to operate the measuring device, and/or for the measuring device to provide meaningful results that indicate a direction and/or strength of the source of interference.

U.S. Pat. No. 8,471,713 discloses a monitor for determining physiological parameters, which comprises a processor configured to determine an amount of ambient electronic interference proximate the sensor. The processor continually determines the amount of interference when in an interference detection mode to allow a caregiver to change locations and monitor the interference as they move. An audio indication of the interference levels is provided by speaking the severity of the interference levels and a visual indication of the interference levels is provided by displaying charts and graphs of the interference levels. However, the manner in which the interference levels are provided are still overly complicated and can be confusing for an untrained user.

There is thus a need for an improved method and device for detecting a source of interference.

SUMMARY OF THE INVENTION

As noted above, a limitation with existing approaches is that the devices that measure interference are expensive and also difficult for untrained users to use appropriately. It would thus be valuable to have an improved method and device for detecting a source of interference, which overcomes the existing problems.

Therefore, according to a first aspect of the invention, there is provided a portable device for monitoring a subject and detecting a source of interference for the portable device. The portable device comprises a detector configured to detect the presence of interference in an environment of the portable device. The portable device also comprises a processor configured to determine a strength of the interference in the environment of the portable device and control a user interface to provide an output at a frequency that depends on the determined interference strength.

In some embodiments, the output may be indicative of any one or more of a proximity of the portable device to a source of the interference for the portable device and a power of the interference from the source of the interference for the portable device.

In some embodiments, the processor may be configured to control any one or more of a light of the user interface to provide a visual output at a frequency that depends on the determined interference strength, wherein the frequency is the rate at which the visual output is provided, a speaker of the user interface to provide an audio output at a frequency that depends on the determined interference strength, wherein the frequency is any one or more of the rate at which the audio output is provided and the frequency corresponding to the pitch of the audio output, and a tactile component of the user interface to provide a tactile output at a frequency that depends on the determined interference strength, wherein the frequency is the rate at which the tactile output is provided.

In some embodiments, the frequency may increase when the interference strength is determined to increase and decrease when the interference strength is determined to decrease. In other embodiments, the frequency may decrease when the interference strength is determined to increase and increase when the interference strength is determined to decrease.

In some embodiments, the portable device may be operable to receive a user input to switch the portable device to an interference detection mode to trigger the detector to begin detecting the presence of interference in the environment of the portable device. In some embodiments, the processor may be configured to prevent the portable device from monitoring the subject when the portable device is in the interference detection mode. In some embodiments, the portable device may be configured to continue to operate irrespective of the determined interference strength.

In some embodiments, the detector may be configured to detect the presence of interference on a wireless data link between the portable device and at least one other device. In some embodiments, the interference may comprise electromagnetic interference. In some embodiments, the portable device may be a transducer. In some embodiments, the portable device may be a fetal or maternal monitoring device.

According to a second aspect of the invention, there is provided a system comprising a portable device as described above and a base unit operable to communicate with the portable device.

In some embodiments, the base unit may comprise the portable device and the portable device may be removable from the base unit.

According to a third aspect of the invention, there is provided a method of operating a portable device for monitoring a subject to detect a source of interference for the portable device. The method comprises detecting the presence of interference in an environment of the portable device, determining a strength of the interference in the environment of the portable device and controlling a user interface to provide an output at a frequency that depends on the determined interference strength.

According to a fourth aspect of the invention, there is provided a computer program product comprising a computer readable medium, the computer readable medium having computer readable code embodied therein, the computer readable code being configured such that, on execution by a suitable computer or processor, the computer or processor is caused to perform the method as described above.

According to the aspects and embodiments described above, the limitations of existing techniques are addressed. In particular, according to the above-described aspects and embodiments, a portable device is provided for monitoring a subject and also for detecting a source of interference for the portable device by controlling a user interface to render an output at a frequency that depends on the interference strength in the environment of the portable device. In this way, it is possible to check whether interference is present in the environment of the portable device using the portable device itself, thereby eliminating the need for additional measurement equipment, and it is also possible to provide information on the strength of the interference using the portable device in a simple, yet effective, manner. The user of the portable device is provided with information that can allow them to easily and quickly identify the source of the interference in order to take appropriate measures to prevent the interference.

There is thus provided an improved method and device for detecting a source of interference, which overcomes the existing problems.

BRIEF DESCRIPTION OF THE DRAWINGS

For a better understanding of the invention, and to show more clearly how it may be carried into effect, reference will now be made, by way of example only, to the accompanying drawings, in which.

DETAILED DESCRIPTION OF THE PREFERRED EMBODIMENTS

As noted above, there is provided an improved method and device for detecting a source of interference, which overcomes the existing problems.

Figure 1:
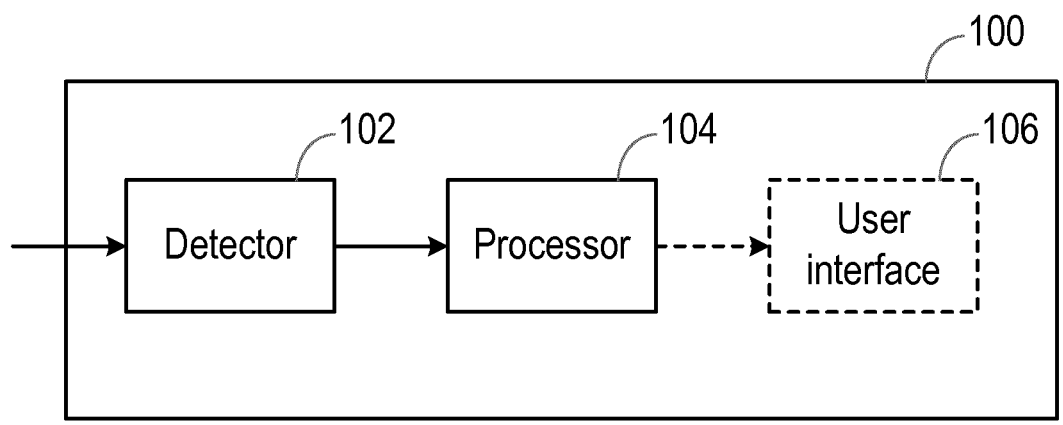
FIG. 1 is a block diagram of a portable device for monitoring a subject and detecting a source of interference for the portable device according to an embodiment.

FIG. 1 shows a block diagram of a device 100 according to an embodiment that can be used for monitoring a subject and detecting a source of interference for the device 100. The device 100 for monitoring a subject and detecting the source of interference is a portable device, such as a portable electronic device.

In some embodiments, for example, the portable device 100 may be a transducer. The portable device 100 can be, for example, a monitoring device such as a medical or health monitoring device, or any other type of device. In embodiments where the portable device 100 is a monitoring device, the portable device 100 may, for example, be a fetal or maternal monitoring device such as a cordless fetal or maternal monitoring device, an ultrasound (US) transducer for monitoring a fetal heart rate with ultrasound Doppler, a TocoMP transducer for monitoring uterine contractions and/or maternal heart rate, or an ECG/IUP transducer for monitoring a fetal and/or maternal electrocardiogram (ECG) and intra uterine pressure (IUP). The portable device 100 may be configured to be used together with a base unit.

The source of the interference may be another device in the environment of the portable device 100. For example, the source of interference may be a monitoring device, monitoring equipment, or any other device that may interfere with the portable device 100 when in the environment of the portable device 100. As the portable device 100 is configured to detect a source of interference as well as being suitable for monitoring a user, the need for additional measurement equipment is eliminated.

With reference to FIG. 1, the portable device 100 for detecting the source of interference comprises a detector 102. The detector 102 is configured to detect the presence of interference in an environment of the portable device 100. The interference can, for example, comprise electromagnetic interference (such as radio frequency interference), or any other type of interference, or any combination of types of interference. In some embodiments, the detector 102 of the portable device 100 may be configured to detect the presence of interference by monitoring received signal strength indicator (RSSI) levels. For example, the detector 102 may be a radio frequency (RF) chip. In some embodiments, the detector 102 may be configured to detect the presence of interference on a wireless data link (or channel) between the portable device 100 and at least one other device. The wireless data link may, for example, be a wireless communications link (or channel) that allows the portable device 100 and the at least one other device to communicate with each other. The at least one other device can, for example, be a base unit (for example, a base station), a server, or any other type of device with which the portable device 100 is operable to communicate.

As illustrated in FIG. 1, the portable device 100 also comprises a processor 104 that controls the operation of the device 100 and that can implement the method described herein. The processor 104 can comprise one or more processors, processing units, multi-core processors or modules that are configured or programmed to control the portable device 100 in the manner described herein. In particular implementations, the processor 104 can comprise a plurality of software and/or hardware modules that are each configured to perform, or are for performing, individual or multiple steps of the method according to the embodiments described herein.

In particular, the processor 104 is configured to determine a strength of the interference in the environment of the portable device 100. More specifically, the processor 104 is configured to determine a strength of the interference that is detected by the detector 102. As mentioned earlier, in some embodiments, the detector 102 of the portable device 100 may be configured to detect the presence of interference by monitoring received signal strength indicator (RSSI) levels. In these embodiments, the RSSI levels may be provided to the processor 102 from the detector 102 as digital values and the processor 102 may be configured to determine the strength of the interference from these digital values.

The processor 104 is also configured to control a user interface 106 to provide (or output or render) an output at a frequency that depends on the determined interference strength. The output can be indicative of any one or more of a proximity of the portable device 100 to a source of the interference for the portable device 100 and a power of the interference from the source of the interference for the portable device 100. In this way, information on the strength of the interference can be provided by the portable device 100, which is the same device that is suitable for monitoring a subject, in a simple and effective manner. As illustrated in FIG. 1, in some embodiments, the portable device 100 itself can comprise at least one user interface 106 configured to provide the output. Alternatively, or in addition, at least one user interface 106 configured to provide the output may be external to (i.e. separate to or remote from) the portable device 100. For example, at least one user interface 106 configured to provide the output may be part of another device.

A user interface 106 may be any user interface suitable to provide (or output or render) an output at a frequency that depends on the determined interference strength. For example, the user interface 106 may comprise one or more lights operable to provide (or output or render) a visual output at a frequency that depends on the determined interference strength. Examples of a light include, but are not limited to, a light emitting diode (LED), or any other light source. The processor 104 may be configured to control one or more lights of the user interface 106 to provide a visual output at a frequency that depends on the determined interference strength. In these embodiments, the frequency can be the rate at which the visual output is provided.

In some embodiments, one or more of the lights of the user interface 106 may be a multi-colored light source. In these embodiments, in addition to the one or more of lights being operable to provide the visual output at a frequency that depends on the determined interference strength, one or more of the lights may also be operable to provide the visual output at a color that depends on the determined interference strength. For example, the processor 104 of the portable device 100 may be configured to control one or more of the lights of the user interface 106 to emit light of a first predetermined color (for example, green) when it is determined by the detector 102 of the portable device 100 that there is no source of interference in the environment of the portable device 100. In this way, the user of the portable device 100 is provided with an indication that there is no source of interference in the environment. The processor 104 of the portable device 100 may also be configured to control one or more of the lights of the user interface 106 to emit light of a second predetermined color (for example, red) that is different to the first predetermined color when it is determined by the detector 102 of the portable device 100 that there is at least one source of interference in the environment of the portable device 100.

Hence, in these embodiments, a color of one or more of the lights of the user interface 106 provides an indication of whether there is a source of interference, and a frequency of the visual output from the one or more lights provides an indication of any one or more of a proximity of the portable device 100 to the source of interference for the portable device 100 and a power of the interference from the source of the interference for the portable device 100.

Alternatively or in addition to the user interface 106 comprising one or more of lights, the user interface 106 may comprise one or more speakers operable to provide (or output or render) an audio output at a frequency that depends on the determined interference strength, one or more tactile or haptic components (such as a vibration function) operable to provide (or output or render) a tactile or haptic output at a frequency that depends on the determined interference strength, or any other user interface component, or any combination of user interface components, that are suitable to provide (or output or render) an output at a frequency that depends on the determined interference strength.

In embodiments where the user interface 106 comprises one or more speakers, the processor 104 may be configured to control one or more speakers of the user interface 106 to provide an audio output at a frequency that depends on the determined interference strength. In these embodiments, the frequency can be any one or more of the rate at which the audio output is provided and the frequency corresponding to the pitch of the audio output. In embodiments where the user interface 106 comprises one or more tactile (or haptic) components, the processor 104 may be configured to control one or more tactile (or haptic) components of the user interface 106 to provide a tactile output at a frequency that depends on the determined interference strength. In these embodiments, the frequency can be the rate at which the tactile output is provided.

In any of the embodiments described herein, the frequency of the output provided by the user interface 106 may increase when the interference strength is determined to increase and may decrease when the interference strength is determined to decrease. Alternatively, the frequency of the output may decrease when the interference strength is determined to increase and may increase when the interference strength is determined to decrease. In some embodiments, the processor 104 of the portable device 100 may be configured to control the user interface 106 to disable the output when any one or more of a proximity or the portable device 100 to the source of the interface for the portable device 100 and a power of the interference from the source of the interference for the portable device 100 is determined to be lower than a predetermined threshold.

In addition to the user interface 106 being configured to provide the output described above, in some embodiments, the user interface 106 may also be configured to receive a user input. For example, in some embodiments, the user interface 106 may allow a user of the portable device 100 to manually enter instructions, data, or information. More specifically, the user interface 106 may allow the user of the portable device 100 to interact with and/or control the portable device 100. The processor 104 may be configured to acquire the user input from the user interface 106 to control the portable device 100 accordingly. Thus, the user interface 106 may comprise one or more switches, one or more buttons, a keypad, a keyboard, a touch screen or an application (for example, on a tablet or smartphone), a display screen, a graphical user interface (GUI) or other visual component, one or more speakers, one or more microphones, or any other audio component, one or more lights, a component for providing tactile feedback (e.g. a vibration function), or any other user interface component, or any combination of user interface components.

Although not illustrated in FIG. 1, in some embodiments, the portable device 100 may also comprise a communications interface (or circuitry) for enabling the portable device 100 to communicate with any interfaces and devices that are internal or external to the portable device 100. The communications interface may communicate with any interfaces and devices wirelessly or via a wired connection. For example, in an embodiment where one or more user interfaces 106 are external to the portable device 100, the communications interface may communicate with the one or more external user interfaces 106 wirelessly or via a wired connection.

It will be appreciated that FIG. 1 only shows the components required to illustrate this aspect of the invention, and in a practical implementation the portable device 100 may comprise additional components to those shown. For example, the portable device 100 may comprise a battery or other power supply for powering the portable device 100 or means for connecting the portable device 100 to a mains power supply.

Figure 2:
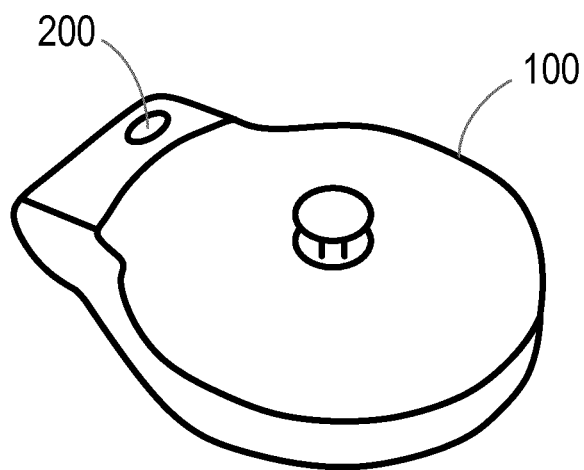
FIG. 2 illustrates a portable device for monitoring a subject and detecting a source of interference for the portable device according to an example embodiment.

FIG. 2 illustrates an example of the portable device 100 for detecting a source of interference for the portable device 100 according to an example embodiment. As illustrated in the example of FIG. 2, in some embodiments, the user interface 106 of the portable device 100 comprises one or more lights 200. In these embodiments, one or more of the lights 200 can be configured to provide (or output or render) a visual output at a frequency that depends on the determined interference strength.

Although not illustrated in FIG. 2, alternatively or in addition to the one or more lights, the user interface 106 may comprise one or more speakers configured to provide (or output or render) an audio output at a frequency that depends on the determined interference strength, a tactile or haptic component (such as a vibration function) configured to provide (or output or render) a tactile or haptic output at a frequency that depends on the determined interference strength, and/or any other user interface component, or any combination of user interface components, that are suitable to provide (or output or render) an output at a frequency that depends on the determined interference strength.

Although also not illustrated in FIG. 2, in some embodiments, the user interface 106 of the portable device 100 may also comprise a user interface component (such as a button) operable to receive a user input for powering on or off the portable device 100, for switching the portable device 100 to an interference detection mode (or service mode), or for triggering other types of operations.

The portable device 100 comprises a detector 102 and a processor 104 (not shown in FIG. 2), as described earlier with reference to FIG. 1. In some embodiments, when the user interface component (such as a button) that is operable to receive a user input is actuated by a user, the detector 102 of the portable device 100 may be configured to trigger the detector 102 to detect of the presence of interference in an environment of the portable device 100. Thus, the portable device 100 can be switched into an interference detection mode (or service mode) according to some embodiments. In some embodiments, the interference detection mode of the portable device 100 may be a dedicated interference detection mode. For example, in some embodiments, the portable device 100 may be prevented from monitoring the subject when the portable device 100 is in the interference detection mode. However, in other embodiments, the portable device 100 may be configured to continue to monitor the subject when the portable device 100 is in the interference detection mode.

In some embodiments where the portable device 100 comprises a communications interface (or circuitry) for enabling the portable device 100 to communicate with any interfaces or devices that are external or internal to the portable device 100, when the user interface component (such as a button) that is operable to receive a user input is actuated by a user, the processor 104 of the portable device 100 may be configured to control the communications interface (or circuitry) to establish a communication with the interface(s) or device(s) mentioned above.

In some embodiments, the portable device 100 may belong to a part of a system. The system may comprise a base unit (for example, a base station) operable to communicate with the portable device 100. In some embodiments, the system can also comprise an apparatus, which may be a medical or health monitoring apparatus (e.g. a fetal or maternal monitoring apparatus). Thus, according to some embodiments, the system may be a monitoring system such as a medical or health monitoring system (e.g. a fetal or maternal monitoring system). In embodiments where the portable device 100 is part of a system comprising a base unit, the portable device 100 may be removable from the base unit. For example, the portable device 100 may have a shape that is complementary to the base unit, such that when the portable device 100 is not in use it can be placed in or on the base unit and when the portable device 100 is to be used it can be removed from the base unit.

When the portable device 100 is in use to detect a source of interference, the user of the portable device 100 can move the portable device 100 to different areas to detect a source of interference in the environment of the portable device 100. For example, the user may hold the portable device 100 while walking around a room in which at least one interfering device is located. In any of the embodiments described herein, the user of the portable device 100 may be, for example, a medical personnel (for example, a clinical caregiver, or any other medical personnel), an engineer (for example, a biomedical engineer, a field service engineer, or any other engineer), or any other user of the portable device 100.

Since the user interface 106 of the portable device 100 (which, in the example embodiment of FIG. 2, comprises at least one or more lights 200) is configured, under the control of the processor 104 of the portable device 100, to provide an output at a frequency that depends on the determined interference strength, the user is able to determine any one or more of a proximity of the portable device 100 to a source of interference for the portable device 100 and a power of the interference from the source of interference for the portable device 100 at different areas of the environment of the portable device 100 by observing the frequency of the output of the portable device 100.

In the example embodiment of FIG. 2, where the user interface 106 comprises one or more lights 200 that are configured to provide (or output or render) a visual output at a frequency that depends on the determined interference strength, the user may observe (for example, continuously observe) whether the frequency of the visual output increases or decreases as they move the portable device 100 to different areas of the environment of the portable device 100. In some embodiments, where the frequency of the output increases when the interference strength is determined to increase, the user may be able to determine from an increase in frequency of the visual output that the portable device 100 is in a closer proximity to a source of interference or that the power of the interference from the source has increased. On the other hand, where the frequency of the output decreases when the interference strength is determined to decrease, the user may be able to determine from a decrease in frequency of the visual output that the portable device 100 is further away from a source of interference or that the power of the interference from the source has decreased. In this way, the user of the portable device 100 may be able to identify the source of the interference to take measures to prevent the interference (such as by turning off or moving the source of the interference).

As described earlier, although not illustrated in FIG. 2, it will be understood that the user interface 106 may alternatively or in addition comprise any one or more of a speaker and a tactile (or haptic) component according to some embodiments. In these embodiments, the processor 104 of the portable device 100 may be configured to control one or more speakers to provide an audio output and one or more tactile (or haptic) components to provide a tactile (or haptic) output, for example, in the same manner described above for the one or more lights.

It will be appreciated that FIG. 2 only shows the visible outer components of an example embodiment of the portable device 100 from a perspective view and, in other practical implementations, the portable device 100 may have different sizes, dimensions, shapes, and/or additional components. For example, the portable device 100 may comprise a mechanism for securing or connecting the portable device 100 to the base unit.

Figure 3:
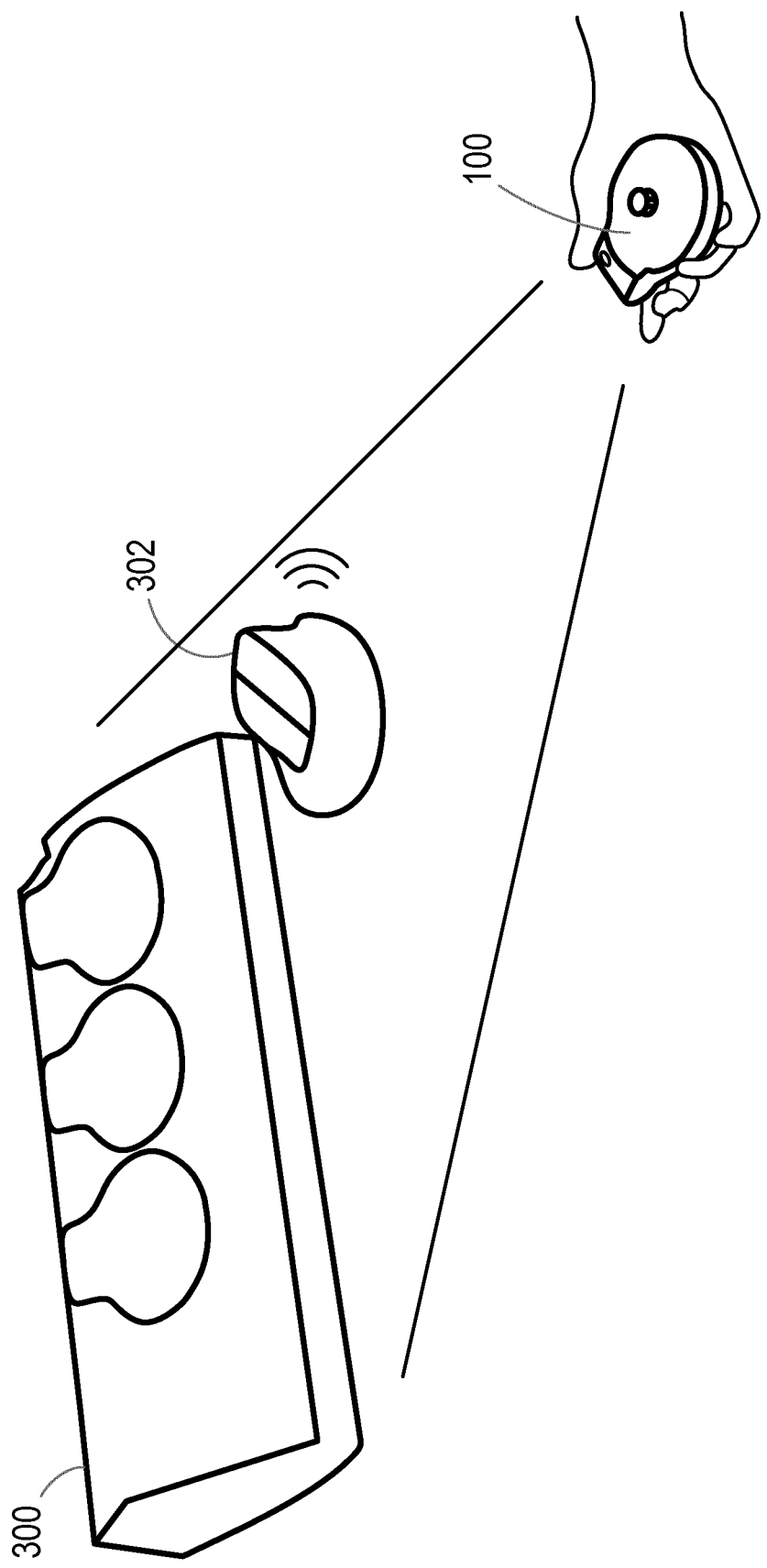
FIG. 3 illustrates a portable device in use for detecting a source of interference according to an embodiment.

FIG. 3 illustrates a portable device 100 in use for detecting a source of interference 302 according to an embodiment.

As illustrated in FIG. 3, in this example embodiment of the portable device 100 in use for detecting a source of the interference, the source of interference is another device (namely, an interfering device) 302. As illustrated in FIG. 3, the interfering device 302 may be removable from a base unit 300. In some embodiments, the interfering device 302 may be a monitoring device (for example, a transducer), such as a fetal or maternal monitoring device, or any other device. The interfering device 302 may be the same type of device as the portable device 100 or a different type of device to the portable device 100.

In some example embodiments, the base unit 300 may comprise a recess for receiving the interfering device 302. The recess may have a size and/or shape that is complementary to that of the interfering device 302. According to some embodiments, a mechanism may be provided at the recess for securing the interfering device 302 to the base unit 300 when the interfering device 302 is not in use. In other embodiments, the base unit 300 may comprise more than one device that are the same or similar to the interfering device 302 and which may also interfere with the portable device 100. In these embodiments, the base unit 300 may comprise a plurality of recesses, each recess having a suitable size and/or shape for receiving the more than one device. Although an example for the configuration of the interfering device 302 has been provided, it will be understood that the interfering device 302 may have any other configuration and can be any device and any form of device that can interfere with the portable device 100.

In embodiments where the portable device 100 is removable from a base unit, the portable device 100 and the base unit may be provided in the form described here with reference to FIG. 3 in respect of the interfering device 302 and the base unit 300 respectively.

Although not illustrated in FIG. 3, the interfering device 302 may further comprise a user interface to receive a user input. For example, in some embodiments, the user interface of the interfering device 302 may allow a user to manually instructions, data, or information. More specifically, the user interface of the interfering device 302 may allow the user to interact with and/or control the interfering device 302. The user interface of the interfering device 302 may comprise one or more switches, one or more buttons, a keypad, a keyboard, a touch screen or an application (for example, on a tablet or smartphone), a display screen, a graphical user interface (GUI) or other visual component, or any other user interface component, or any combination of user interface components.

Although also not illustrated in FIG. 3, the interfering device 302 may comprise a communications interface (or circuitry) for enabling the interfering device 302 to communicate with any interfaces and devices that are internal or external to the interfering device 302. The communications interface of the interfering device 302 may communicate with any interfaces and devices wirelessly or via a wired connection.

Although examples of the type and form of the source of interference have been provided for the purpose of illustrating the portable device 100 in use with reference to FIG. 3, it will be understood that the portable device 100 may detect interference from any other source of interference, or any combination of sources of interference.

In some embodiments, the portable device 100 may be configured to transmit data (for example, to one or more other devices) in real time. In some embodiments, the portable device 100 may continue to operate (as normal) irrespective of the determined interference strength. In some embodiments, the portable device 100 can be operated by a user simultaneously to monitor a subject and to identify a source of interference. As mentioned earlier, in any of the embodiments described herein, the user of the portable device 100 can, for example, be a medical personnel (for example, a clinical caregiver, or any other medical personnel), an engineer (for example, a biomedical engineer, a field service engineer, or any other engineer), or any other user of the portable device 100.

It will be appreciated that FIG. 3 only shows an example embodiment of the portable device 100 in use and, in other practical implementations, the illustrated system may comprise additional components and/or devices (such as one or more additional portable devices 100).

Figure 4:
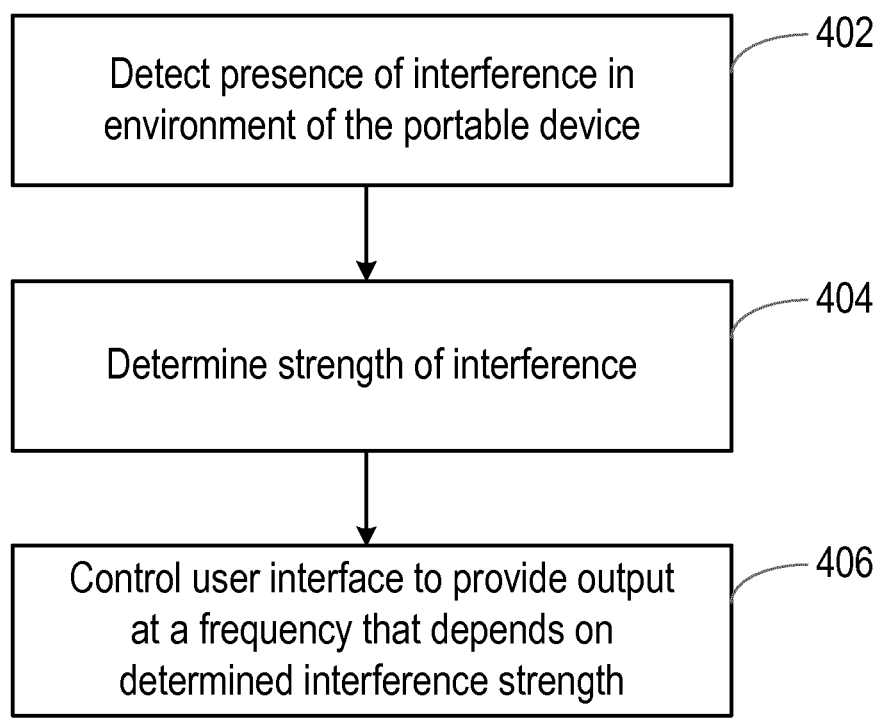
FIG. 4 illustrates a method of operating a portable device for monitoring a subject to detect a source of interference for the portable device according to an embodiment.

FIG. 4 illustrates a method 400 of operating the portable device 100 described herein to detect a source of interference for the portable device 100, according to an embodiment. The illustrated method 400 can generally be performed by or under the control of the processor 104 of the portable device 100.

With reference to FIG. 4, at block 402, the presence of interference is detected in an environment of the portable device 100. More specifically, the detector 102 detects the presence of interference. For example, the processor 104 may control the detector 102 to detect the presence of interference. In some embodiments, the portable device 100 may be operable to receive a user input to switch the portable device 100 to an interference detection mode (or service mode) to trigger the detector 102 to begin detecting the presence of interference in the environment of the portable device 100. The processor 104 may receive the user input and then control the detector 102 to detect the presence of interference in the environment of the portable device 100.

In some embodiments, the portable device 100 may be configured to be switched into the interference detection mode while the portable device 100 is located in or on the base unit of the system. In these embodiments, the processor 104 of the portable device 100 may receive the user input to switch the portable device 100 to an interference detection mode from (for example, a touch screen of) a user interface of the base unit with which the portable device 100 is operable to communicate or from (for example, a touch screen of) a user interface of an associated apparatus. As mentioned earlier, the associated apparatus may, for example, be a monitoring apparatus such as a medical or health monitoring apparatus (e.g. a fetal or maternal monitoring apparatus).

Returning back to FIG. 4, at block 404, a strength of the interference is determined in the environment of the portable device 100. More specifically, the processor 104 determines the strength of the interference in the environment of the portable device 100. At block 406 of FIG. 4, a user interface 106 is controlled to provide an output (such as the visual output, the audio output, and/or the tactile output described earlier) at a frequency that depends on the determined interference strength in the manner described herein. More specifically, the processor 104 controls the user interface 106 to provide the output. As mentioned earlier, the output can be indicative of any one or more of a proximity of the portable device to a source of the interference for the portable device 100 and a power of the interference from the source of the interference for the portable device 100.

There is therefore provided an improved method and device for detecting a source of interference.

There is also provided a computer program product comprising a computer readable medium, the computer readable medium having computer readable code embodied therein, the computer readable code being configured such that, on execution by a suitable computer or processor, the computer or processor is caused to perform the method or methods described herein.

Variations to the disclosed embodiments can be understood and effected by those skilled in the art in practicing the claimed invention, from a study of the drawings, the disclosure and the appended claims. In the claims, the word "comprising" does not exclude other elements or steps, and the indefinite article "a" or "an" does not exclude a plurality. A single processor or other unit may fulfil the functions of several items recited in the claims. The mere fact that certain measures are recited in mutually different dependent claims does not indicate that a combination of these measures cannot be used to advantage. A computer program may be stored/distributed on a suitable medium, such as an optical storage medium or a solid-state medium supplied together with or as part of other hardware, but may also be distributed in other forms, such as via the Internet or other wired or wireless telecommunication systems. Any reference signs in the claims should not be construed as limiting the scope.

The invention claimed is:

1. A portable device for monitoring a subject and detecting a source of interference for the portable device, the portable device comprising:
   a detector configured to detect the presence of interference in an environment of the portable device; and
   a processor configured to:
   determine a strength of the interference in the environment of the portable device; and
   control a user interface to provide an output at a frequency that depends on the determined interference strength.

2. A portable device as claimed in claim 1, wherein the output is indicative of any one or more of a proximity of the portable device to a source of the interference for the portable device and a power of the interference from the source of the interference for the portable device.

3. A portable device as claimed in claim 1, wherein the portable device is a transducer.

4. A portable device as claimed in claim 1, wherein the processor is configured to control any one or more of:
   a light of the user interface to provide a visual output at a frequency that depends on the determined interference strength, wherein the frequency is the rate at which the visual output is provided;
   a speaker of the user interface to provide an audio output at a frequency that depends on the determined interference strength, wherein the frequency is any one or more of the rate at which the audio output is provided and the frequency corresponding to the pitch of the audio output; and
   a tactile component of the user interface to provide a tactile output at a frequency that depends on the determined interference strength, wherein the frequency is the rate at which the tactile output is provided.

5. A portable device as claimed in claim 1, wherein:
   the frequency increases when the interference strength is determined to increase and decreases when the interference strength is determined to decrease; or
   the frequency decreases when the interference strength is determined to increase and increases when the interference strength is determined to decrease.

6. A portable device as claimed in claim 1, wherein the portable device is operable to receive a user input to switch the portable device to an interference detection mode to trigger the detector to begin detecting the presence of interference in the environment of the portable device.

7. A portable device for monitoring a subject and detecting a source of interference for the portable device, the portable device comprising:
   a detector configured to detect the presence of interference in an environment of the portable device; wherein the portable device is operable to receive a user input to switch the portable device to an interference detection mode to trigger the detector to begin detecting the presence of interference in the environment of the portable device and
   a processor configured to: determine a strength of the interference in the environment of the portable device; and control a user interface to provide an output at a frequency that depends on the determined interference strength, wherein the processor is configured to prevent the portable device from monitoring the subject when the portable device is in the interference detection mode.

8. A portable device as claimed in claim 1, wherein the portable device is configured to continue to operate irrespective of the determined interference strength.

9. A portable device as claimed in claim 1, wherein the detector is configured to detect the presence of interference on a wireless data link between the portable device and at least one other device.

10. A portable device as claimed in claim 1, wherein the interference comprises electromagnetic interference.

11. A portable device as claimed in claim 1, wherein the portable device is a fetal or maternal monitoring device.

12. A system comprising:
   a portable device as claimed in claim 1; and
   a base unit operable to communicate with the portable device.

13. A system as claimed in claim 12, wherein the base unit comprises the portable device and the portable device is removable from the base unit.

14. A method of operating a portable device for monitoring a subject to detect a source of interference for the portable device, the method comprising:
   detecting the presence of interference in an environment of the portable device;
   determining a strength of the interference in the environment of the portable device; and
   controlling a user interface to provide an output at a frequency that depends on the determined interference strength.

15. A computer program product comprising a computer readable medium, the computer readable medium having computer readable code embodied therein, the computer readable code being configured such that, on execution by a suitable computer or processor, the computer or processor is caused to perform the method as claimed in claim 14.

* * * * *